United States Patent
Desai et al.

(10) Patent No.: US 6,759,877 B1
(45) Date of Patent: Jul. 6, 2004

(54) DYNAMIC CIRCUITRY WITH ON-CHIP TEMPERATURE-CONTROLLED KEEPER DEVICE

(75) Inventors: Shaishav A. Desai, Sunnyvale, CA (US); Claude R. Gauthier, Cupertino, CA (US); Anup S. Mehta, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/337,523

(22) Filed: Jan. 7, 2003

(51) Int. Cl.[7] ............................................. H03K 19/20
(52) U.S. Cl. ..................................... 326/121; 326/119
(58) Field of Search ............................. 326/31, 32, 119, 326/121, 112, 191

(56) References Cited

U.S. PATENT DOCUMENTS

| | | | | |
|---|---|---|---|---|
| 5,118,971 A | * | 6/1992 | Schenck | 326/32 |
| 5,136,182 A | * | 8/1992 | Fawal | 327/541 |
| 5,933,038 A | * | 8/1999 | Klass | 327/208 |
| 6,002,292 A | * | 12/1999 | Allen et al. | 327/379 |
| 6,115,319 A | * | 9/2000 | Kinoshita et al. | 365/233 |
| 6,265,900 B1 | * | 7/2001 | Potter | 326/121 |
| 6,541,999 B2 | * | 4/2003 | Gergintschw et al. | 326/32 |

* cited by examiner

Primary Examiner—Michael Tokar
Assistant Examiner—Linh V Nguyen
(74) Attorney, Agent, or Firm—Osha & May L.L.P.

(57) ABSTRACT

A method and apparatus that dynamically control an amount of offset current generated by a keeper device are provided. Further, a method and apparatus that use a temperature-controlled keeper device to dynamically optimize an evaluation performance of a dynamic circuit are provided. In particular, when IC temperature is relatively high, i.e., there is increased current leakage in the dynamic circuit, an amount of offset current output by the temperature-controlled keeper may be increased, thereby preventing a dynamic node of the dynamic circuit from being discharged, or otherwise adversely affected, by the increased current leakage. Alternatively, when the IC temperature is relatively low, i.e., there is decreased current leakage in the dynamic circuit, the amount of offset current output by the temperature-controlled keeper may be decreased, thereby ensuring that the offset current is not so large that it severely degrades the evaluation performance.

17 Claims, 3 Drawing Sheets

DYNAMIC CIRCUITRY WITH ON-CHIP TEMPERATURE-CONTROLLED KEEPER DEVICE

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having: a microprocessor (12), memory (14), integrated circuits (16) that have various functionalities, communication paths (18), i.e., buses and wires, that transfer data among the aforementioned components of the computer system (10), and a clock (20) that is used to synchronize operations of the computer system (10).

The various computations and operations performed by the computer system are facilitated through the use of signals that provide electrical pathways for data to propagate between the various components of the computer system. In a general sense, the passing of data onto a signal may be accomplished by changing, i.e., transitioning, the logical value, i.e., the logical state, of the signal. Specifically, the logical state of a signal may be transitioned by either raising the voltage of the signal or reducing the voltage of the signal. When the voltage is raised, the signal is said to be at a "logic high," and when the voltage is reduced, the signal is said to be at a "logic low."

A microprocessor (12), such as the one shown in FIG. 1, includes various IC computational blocks, e.g., arithmetic logic units, that store, transfer, and manipulate logic signals in order to perform arithmetic and logic operations. In order to maximize performance, IC computational blocks are typically fabricated using synchronous logic components, i.e., logic components whose operations may be synchronized to the logical transitions of a particular signal (such as a clock signal generated by the clock (20)). One example of a synchronous logic component is a dynamic circuit, i.e., a logic circuit that, given a particular input combination, outputs a constant value for the input combination for a specified period of time. Thus, given its time-dependent nature, the dynamic circuit may be used to output the constant value for specified logical transitions of the clock signal.

A typical dynamic circuit is shown in FIG. 2. Note that, typically, dynamic circuits generate output values for logic operations such as AND, NAND, OR, and NOR. In particular, the dynamic circuit of FIG. 2 generates an output value for a logical OR operation. The dynamic circuit shown includes the following circuitry: a first set of input devices (22), a second set of input devices (24), a first dynamic node (26), a second dynamic node (28), a first precharge device (30), a second precharge device (32), a first keeper device (36), a second keeper device (38), and a NAND gate (34). In addition to the abovementioned circuitry, the dynamic circuit includes a clock signal input clk that is input to the first and second precharge devices (30, 32) and an output signal out that is output by the NAND gate (34).

In general, the operation of the dynamic circuit may be broken into a precharge phase and an evaluation phase. In the dynamic circuit shown in FIG. 2, the precharge phase occurs when clk is 'low,' and the evaluation phase occurs when clk is 'high.' In the precharge phase, the dynamic circuit is readied for the evaluation phase by the signal to which the dynamic circuit is synchronized, i.e., clk. In particular, when clk transitions 'low,' the first and second precharge devices (30, 32) turn 'on' and respectively force the values of the dynamic nodes (26, 28) to 'high.' In turn, the NAND gate (34) forces the value of the output signal out to 'low.'

Then, in the evaluation phase, the logical OR operation represented by the dynamic circuit is evaluated. In particular, when clk transitions 'high,' the first and second precharge devices (30, 32) turn 'off,' and the values of the first and second dynamic nodes (26, 28) are respectively controlled by the first and second sets of input devices (22, 24). Thus, if either the input value generated by the first set of input devices (22) or the input value generated by the second set of input devices (24) transitions 'low,' then out is forced 'high.' However, if the input values of both the first and second sets of transistors (22, 24) remain 'low,' then out remains 'low.'

The input values generated by the first and second sets of input devices (22, 24) are determined as follows. In FIG. 2, the first set of input devices (22) and the second set of input devices (24) are both composed of n-type transistors whose states are dependent on logical values input to the dynamic circuit. As shown, the n-type transistors are arranged into transistor pairs, i.e., pull-downs, that represent AND functions. Thus, during the evaluation phase, one of two things may happen in either one or both sets of input devices. First, in a single set of input devices, if the one or more of the pull-downs switch 'on,' the corresponding dynamic node is connected to ground, i.e., the value of the dynamic node is driven 'low.' On the other hand, if, in a single set of input devices, none of the pull-downs switch 'on,' the corresponding dynamic node remains disconnected from ground, i.e., the value of the dynamic node remains 'high.'

Note that, in the dynamic circuit, the first and second keeper devices (36, 38) are used to prevent current leakage from the first and second sets of input devices (22, 24). Specifically, during the evaluation phase, sub-threshold leakage current may flow through some or all of the pull-downs even when the pull-downs are 'off.' As a result, the voltage on the internal dynamic node may fall, resulting in erroneous evaluation. Thus, to ensure that, during the evaluation phase, current leakage from a pull-down does not discharge the first and/or second dynamic nodes (22, 24), the first and second keeper devices (36, 38) are turned 'on' by out to increase an amount of pull-up current flowing through the first and second dynamic nodes (22, 24).

Note that, for a typical dynamic circuit such as shown in FIG. 2, the strengths, i.e., sizes, of keeper devices are determined during a design phase of the dynamic circuit. In particular, keeper devices are sized based on a worst case leakage corner simulated for the dynamic circuit (i.e., greater current leakage typically requires larger keeper devices). However, during the evaluation phase, an amount of offset current generated by keeper devices, especially large keeper devices, often negatively impacts speed and/or functionality of the pull-downs included in the sets of input devices. Thus, keeper devices cannot be made arbitrarily large without degrading the dynamic circuit's performance.

In many cases, this fundamental tradeoff between keeper device strength and evaluation performance imposes a limit on a number of pull-downs that may be included in a particular set of input devices used to control a particular dynamic node. Increasing the number of evaluation devices in a dynamic circuit typically increases the amount of leakage current proportionally. Therefore larger keeper devices are required. However, at some point, the size of the keeper device becomes so large that a single evaluation transistor is unable to overcome the keeper device's size and pull the dynamic node low. As a result, an upper limit is enforced on a number of input values that may be used for the particular arithmetic and/or logical computation performed by a dynamic circuit or by a computational block that incorporates a dynamic circuit.

SUMMARY OF INVENTION

According to one aspect of the invention, an integrated circuit comprises a temperature sensor arranged to -generate a temperature signal dependent on a temperature of the integrated circuit; and a dynamic logic circuit, comprising: a first dynamic node and a first keeper stage operatively connected to the first dynamic node and arranged to receive the temperature signal, wherein the first keeper stage controls an amount of a first offset current to the first dynamic node.

According to another aspect of the invention, an integrated circuit comprises means for generating a temperature signal dependent on a temperature of the integrated circuit; and dynamic logic means for generating an output signal dependent on a plurality of signals, comprising: input means for inputting the plurality of inputs; means for propagating a dynamic value dependent on the input means; and means for controlling an offset current to the means for propagating dependent on the dynamic value and the temperature signal.

According to another aspect of the invention, a method for performing dynamic logic operations comprises inputting a clock signal and a set of logical values; setting a value of a dynamic node dependent on the clock signal and the set of logical values; inputting a first amount of offset current to the dynamic node dependent on the value of the dynamic node; and inputting a second amount of offset current to the dynamic node dependent on the value of the dynamic node and a temperature signal.

Other aspects and advantages of the invention will be apparent from the following description and the appended claims.

DETAILED DESCRIPTION

Embodiments of the present invention relate to a method and apparatus for dynamically controlling an amount of offset current generated by a keeper device. Embodiments of the present invention further relate to a method and apparatus that use a temperature-controlled keeper device to dynamically optimize an evaluation performance of a dynamic circuit.

In one aspect, the present invention relates to an integrated circuit that uses an on-chip temperature (which in some embodiments, is measured by an on-chip temperature sensor) to dynamically control operation of a keeper stage used to offset current leakage at a dynamic node of a dynamic circuit. In particular, an amount of offset current output by the keeper stage to the dynamic node is increased or decreased dependent on the on-chip temperature experienced by the dynamic circuit.

Figure 1:
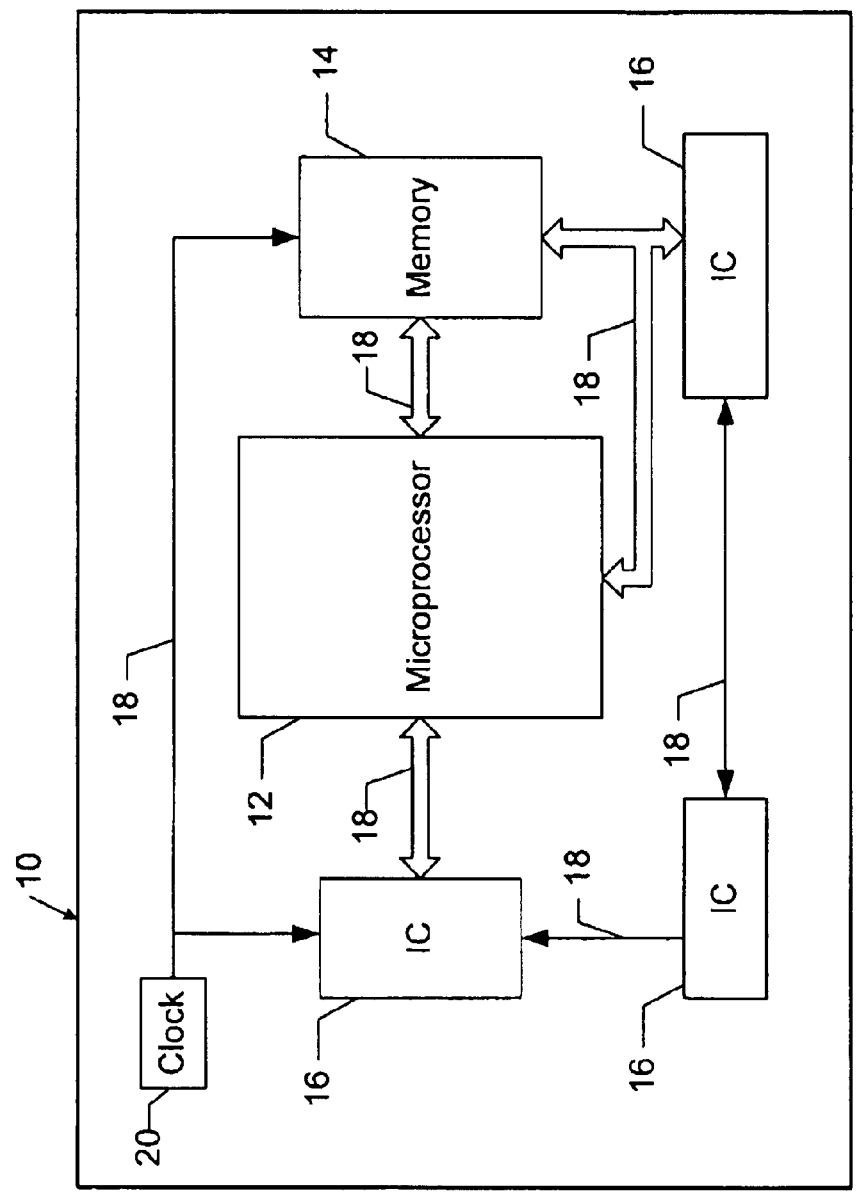
FIG. 1 shows a typical computer system.
Figure 2:
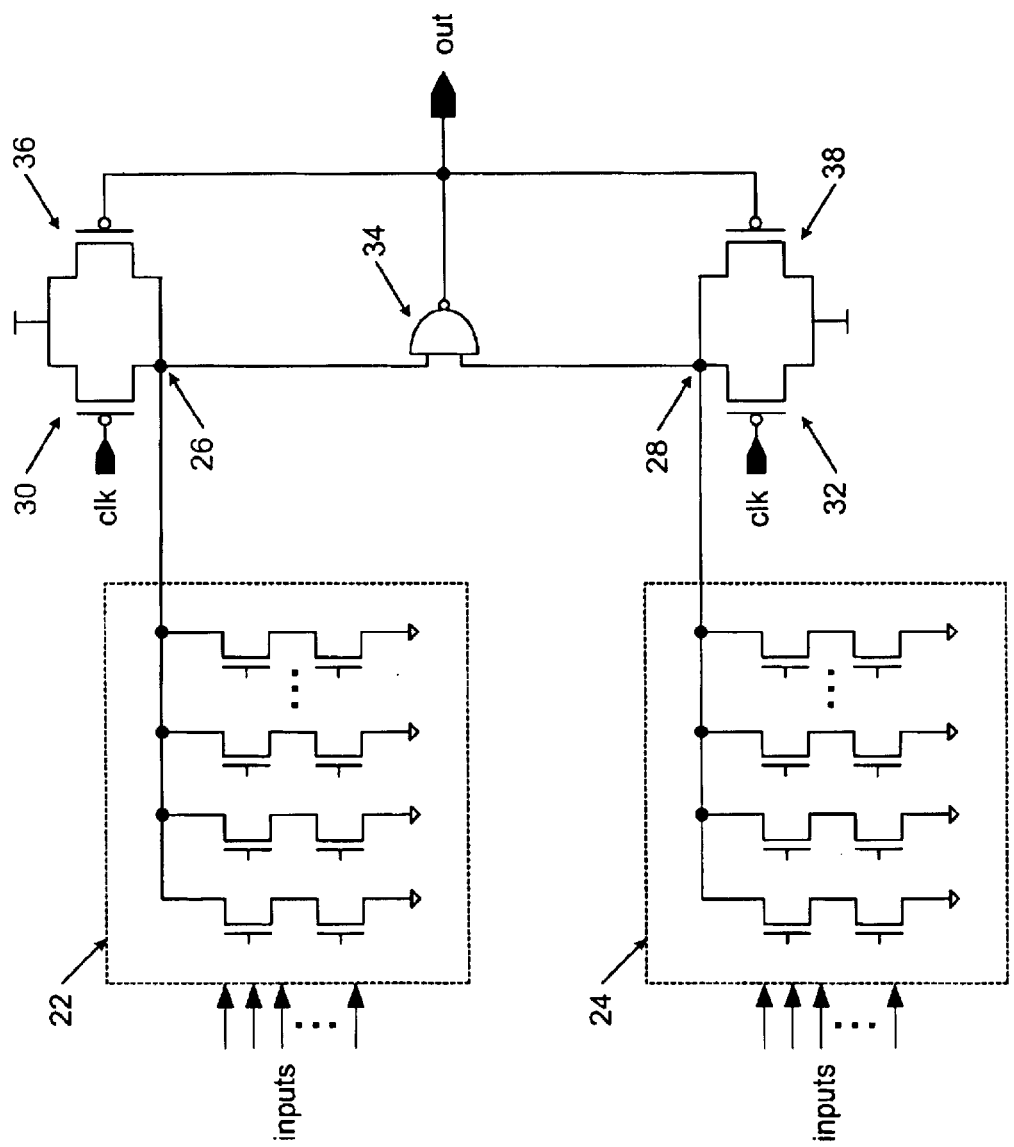
FIG. 2 shows circuit schematic of a typical dynamic circuit.
Figure 3:
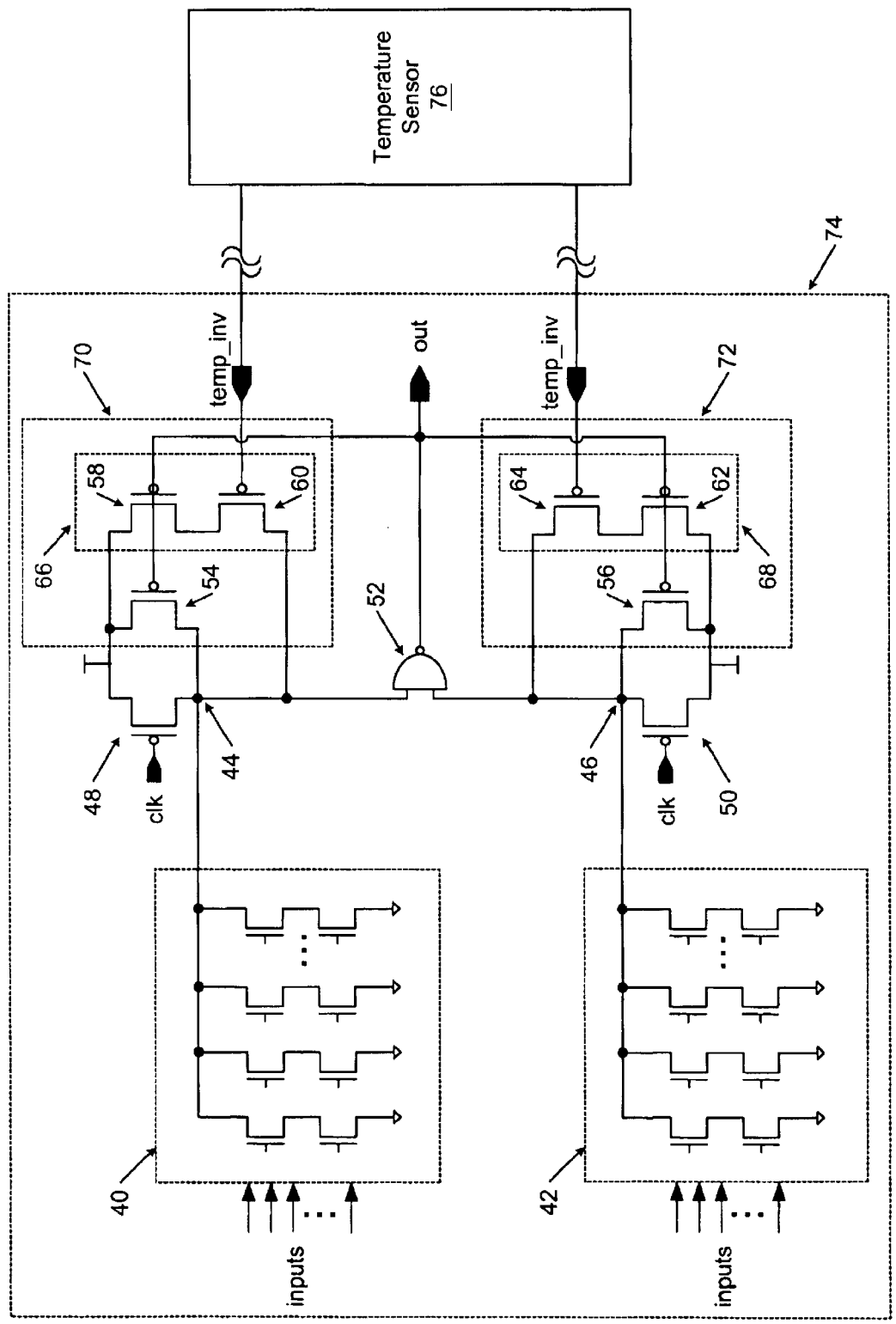
FIG. 3 shows a circuit schematic of a dynamic circuit in accordance with an embodiment of the present invention.

FIG. 3 shows an exemplary circuit-level schematic of a dynamic circuit (74) in accordance with an embodiment of the present invention. The dynamic circuit (74) shown includes the following circuitry: a first set of input devices (40), second set of input devices (42), a first dynamic node (44), a second dynamic code (46), a first precharge device (48), a second precharge device (50), a first keeper stage (70), a second keeper stage (72), and a NAND gate (52). Further, the first and second keeper stages (70, 72) respectively include first and second temperature-independent keeper devices (54, 56) and first and second temperature-dependent keeper stages (66, 68). The first temperature-dependent keeper stage 66) includes a first keeper device (58) and a second keeper device (60), and the second temperature-dependent keeper stage (68) includes a third keeper device 62) and a fourth keeper device (64).

In addition to the abovementioned circuitry, the dynamic circuit (74) includes a clock signal input clk that is input to the first and second precharge devices (30, 32), an output signal out that is output by the NAND gate (34), and a temperature input temp_inv that is input to first and second keeper stages (70, 72). Note that, in some embodiments, the temperature input temp_inv is a complement, i.e., an inverted form, of a temperature signal generated using a measured temperature of the dynamic circuit (74). In some embodiments, the temperature of the dynamic circuit (74) is measured by a temperature sensor (76) which may be disposed on an integrated circuit on which the dynamic circuit (74) resides.

As shown in FIG. 3, the first set of input devices (40) and the first precharge device (48) are used to control a value of the first dynamic node (44) dependent on the clock signal input clk. For the embodiment shown, when clk is 'low,' i.e., during a precharge phase, the first precharge device (48) precharges the value of the first dynamic node (44) to high using a power supply connected to the first precharge device's (48) drain gate. Then, when clk is 'high,' i.e., during an evaluation phase, the first set of input devices (40) sets the value of the first dynamic node (44) to a first dynamic value. The first dynamic value is generated by the first set of input devices (40) based on a first set of logical values input by pull-downs of the first set of input devices (40).

Likewise, the second set of input devices (42) and the second precharge device (50) control a value of the second dynamic node (46) dependent on clk. As before, when clk is 'low,' i.e., during a precharge phase, the second precharge device (50) precharges the value of the second dynamic node (46) to 'high' using a power supply connected to the second precharge device's (50) drain gate. Then, when clk is 'high,' i.e., during an evaluation phase, the second set of input devices (42) sets the value of the second dynamic node (46) to a second dynamic value. The second dynamic value is generated by the second set of input devices (42) based on a second set of logical values input by pull-downs of the second set of input devices (42).

Referring to FIG. 3, the first dynamic node (44) and the second dynamic node are connected to the NAND gate (52). Using the values of the first and second dynamic nodes (44, 46), the NAND gate (52) determines a value of the output signal out, which is used as an output of the dynamic circuit (74). In addition to being output by the dynamic circuit (74), out is fed into the first and second keeper stages (70, 72). In particular, out is used to control the operation of the first and second temperature-independent keeper devices (54, 56), the first keeper device (58), and the third keeper device (62). Specifically, when out is 'high,' the first and second keeper stages (70, 72) turn 'off' and do not conduct offset currents; and when out is 'low,' the first and second keeper stages (70, 72) turn 'on' and respectively conduct a first offset current and a second offset current to the first and second dynamic nodes (44, 46).

Note that, unless otherwise stated, the following description of FIG. 3 assumes that the value of the out signal is 'low,' i.e., the first and second keeper stages (70, 72) are 'on.' In the embodiment shown in FIG. 3, the amounts of the first and second offset currents are regulated using the temperature input temp_inv. In particular, when the measured temperature is relatively 'high,' i.e., temp_inv is 'low,' the first and second keeper stages (70, 72) respectively increase the amounts of the first and second offset currents; and when the measured temperature is relatively 'low,' i.e., temp_inv is 'high,' the first and second keeper stages (70, 72) respectively decrease the amounts of the first and second offset currents.

Note that, in the embodiment shown in FIG. 3, the first offset current includes a first portion generated by the first temperature-independent keeper device (54) and a second portion generated by the first temperature-dependent keeper stage (66). When the measured temperature is relatively low, i.e., temp inv is 'high,' only the first portion of the first offset current is generated. In particular, when temp_inv is 'low,' the second keeper device (60) turns 'off,' and the first temperature dependent keeper stage (66) is disconnected from the first dynamic node (44). Alternatively, when the measured temperature is relatively 'high,' i.e., temp_inv is 'low,' both the first and second portions of the first offset current are generated. In particular, when temp_inv is 'low,' the second keeper device (60) turns 'on,' and the first temperature dependent keeper stage (66) is connected to the first dynamic node (44).

Likewise, the second offset current includes a first portion generated by the second temperature-independent keeper device (56) and a second portion generated by the second temperature-dependent keeper stage (68). When the measured temperature is relatively low, i.e., temp_inv is 'high,' only the first portion of the second offset current is generated. In particular, when temp_inv is 'low,' the fourth keeper device (64) turns 'off,' and the second temperature dependent keeper stage (68) is disconnected from the second dynamic node (46). Alternatively, when the measured temperature is relatively high, i.e., temp_inv is 'low,' both the first and second portions of the second offset current are generated. In particular, when $temp_{inv}$ is 'low,' the fourth keeper device (64) turns 'on,' and the second temperature-dependent keeper stage (68) is connected to the second dynamic node (46).

Thus, when IC temperature is relatively 'high,' i.e., there is increased current leakage from the first and second sets of input devices (40,42), the offset currents output to the first and second dynamic nodes (44, 46) may be increased, thereby ensuring that the first and second dynamic nodes (44, 46) are not discharged by increased current leakage. Alternatively, when the IC temperature is relatively 'low,' i.e., there is decreased current leakage from the first and second sets of input devices (40,42), the offset currents output to the first and second dynamic nodes (44, 46) may be decreased, thereby ensuring that the offset currents are not so large that they severely degrade evaluation performance.

Further, because the offset currents output to the first and second dynamic nodes (44,46) may be increased or decreased based on the IC temperature, the number of pull-downs that may be included in the first and second sets of input devices (40, 42) may be increased, thereby increasing the potential fan-in of the dynamic circuit (74). In particular, when the number of pull-downs included in a set of input devices increases, the current leakage that is generated by that set of input devices at high temperatures may also increase. Because the offset current output to a dynamic node may be increased when the IC temperature is relatively 'high,' the large amount of current leakage generated by the corresponding set of input devices may be prevented from discharging the dynamic node. In addition, when the IC temperature is relatively 'low,' the amount of offset current may be reduced so that a speed at which the set of input devices evaluates a dynamic value is not slowed down.

Those skilled in the art will appreciate that, in one or more embodiments, additional temperature dependent keeper stages (66, 68) may be included in the first and/or second keeper stages (70, 72) without departing from the scope of the present invention. In particular, in a case involving the first keeper stage (70), one or more additional temperature dependent keeper stages (66, 68) may be connected in parallel with the first temperature dependent keeper stage (66) in order to provide increased keeper size variation. As a result, variable amounts of offset current may be provided to the first dynamic node (44) and/or multiple temperature signals may be used to control first keeper stage (66). In some embodiments, the multiple temperature signals may be generated by distinct bit signal lines of a multi-bit bus signal.

Advantages of the present invention may include one or more of the following. In one or more embodiments, because an on-chip temperature is used to dynamically control operation of a keeper stage used to offset current leakage at a dynamic node of a dynamic circuit, an amount of offset current output by the keeper stage to the dynamic node may be increased or decreased dependent on the on-chip temperature experienced by the dynamic circuit In one or more embodiments, because an offset current generated by a keeper stage of a dynamic circuit may be increased when the dynamic circuit experiences a relatively high on-chip temperature, the dynamic circuit may ensure that a dynamic node of the dynamic circuit is not discharged by increased current leakage in the dynamic circuit.

In one or more embodiments, because an offset current generated by a keeper stage of a dynamic circuit may be decreased when the dynamic circuit experiences a relatively low on-chip temperature, the dynamic circuit may ensure that the offset current is not so large that it severely degrades an evaluation performance of the dynamic circuit.

In one or more embodiments, because an offset current generated by a keeper stage of a dynamic circuit may be regulated based on an on-chip temperature, a number of pull-downs that may be included in a set of input devices used to control a dynamic node of the dynamic circuit may be increased. Thus, a number of input values that may be used for the particular arithmetic and/or logical computation performed by the dynamic circuit or by a computational block that incorporates a dynamic circuit may be increased.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a temperature sensor arranged to generate a temperature signal; and
   a dynamic logic circuit, comprising:
   a first dynamic node, and
   a first keeper stage operatively connected to the first dynamic node and arranged to receive the temperature signal, wherein the first keeper stage controls an amount of a first offset current to the first dynamic node dependent on the temperature signal,
   wherein the temperature signal is indicative of a temperature experienced by the dynamic logic circuit.

2. The integrated circuit of claim 1, wherein the first keeper stage increases the amount of the first offset current upon assertion of the temperature signal.

3. The integrated circuit of claim 1, wherein the first keeper stage decreases the amount of the first offset current upon de-assertion of the temperature signal.

4. The integrated circuit of claim 1, wherein the first keeper stage comprises:
   a first temperature-independent keeper device operatively connected to the first dynamic node and arranged to receive an output signal of the dynamic logic circuit, wherein the first temperature-independent keeper device controls a first portion of the first offset current to the first dynamic node dependent on the output signal; and a first temperature-dependent keeper stage operatively connected to the first dynamic node and arranged to receive the output signal and the temperature signal, wherein the first temperature-dependent keeper stage controls a second portion of the first offset current to the first dynamic node dependent on the output signal and the temperature signal.

5. The integrated circuit of claim 4, wherein the temperature-dependent keeper stage comprises:

a first keeper device arranged to receive the output signal; and a second keeper device operatively connected to the first keeper device and the first dynamic node and arranged to receive the temperature signal.

6. The integrated circuit of claim 1, wherein the dynamic logic circuit further comprises:

a first precharge device operatively connected to the first dynamic node and arranged to receive a clock signal, wherein the first precharge device precharges the first dynamic node dependent on the clock signal; and a first set of input devices operatively connected to the first dynamic node and arranged to receive a first set of logic values, wherein the first set of input devices discharges the first dynamic node dependent on the first set of logic values and the clock signal.

7. The integrated circuit of claim 6, wherein the dynamic logic circuit further comprises:

a second dynamic node;

a second keeper stage operatively connected to the second dynamic node and arranged to receive the temperature signal, wherein the second keeper stage controls an amount of a second offset current to the second dynamic node, comprising:

a second temperature-independent keeper device operatively connected to the second dynamic node and arranged to receive the output signal, wherein the second temperature-independent keeper device controls a first portion of the second offset current to the second dynamic node dependent on the output signal; and a second temperature-dependent keeper stage operatively connected to the second dynamic node and arranged to receive the output signal and the temperature signal, wherein the second temperature-dependent keeper stage outputs a second portion of the second offset current to the second dynamic node dependent on the output signal and the temperature signal; and a logic gate operatively connected to the first dynamic node and the second dynamic node, wherein the logic gate is adapted to generate the output signal dependent on the value of the first dynamic node and a value of the second dynamic node.

8. The integrated circuit of claim 7, wherein the second temperature-dependent keeper stage comprises:

a third keeper device arranged to receive the output signal; and a fourth keeper device operatively connected to the third keeper device and the second dynamic node and arranged to receive the temperature signal.

9. The integrated circuit of claim 7, wherein the dynamic logic circuit further comprises:

a second precharge device operatively connected to the second dynamic node and arranged to receive the clock signal, wherein the second precharge device precharges the second dynamic node dependent on the clock signal; and a second set of input devices operatively connected to the second dynamic node and arranged to receive a second set of logic values, wherein the second set of input devices discharges the second dynamic node dependent on the second set of logic values and the clock signal.

10. The integrated circuit of claim 1, wherein the temperature signal comprises a plurality of bits, and wherein the temperature signal is operatively connected to a plurality of dynamic logic circuits.

11. An integrated circuit, comprising:

means for generating a temperature signal; and dynamic logic means for generating an output signal dependent on a plurality of inputs, comprising:

input means for inputting the plurality of inputs;

means for propagating a dynamic value dependent on the input means; and means for controlling an offset current to the means for propagating dependent on the dynamic value and the temperature signal, wherein the temperature signal is indicative of a temperature experienced by the dynamic logic means.

12. The integrated circuit of claim 11, wherein the means for controlling the offset current comprises:

means for outputting a first portion of the offset current dependent on the output signal of the dynamic logic means; and means for outputting a second portion of the offset current dependent on the output signal and the temperature signal.

13. The integrated circuit of claim 11, wherein the dynamic logic means further comprises:

precharge means for precharging the means for propagating dependent on a clock signal, wherein the input means discharges the means for propagating dependent on the clock signal.

14. A method for performing dynamic logic operations, comprising:

inputting a clock signal and a set of logical values;

setting a value of a dynamic node dependent on the clock signal and the set of logical values;

inputting a first amount of offset current to the dynamic node dependent on the value of the dynamic node; and inputting a second amount of offset current to the dynamic node dependent on the value of the dynamic node and a temperature signal, wherein the temperature signal is indicative of a temperature experienced by the dynamic logic operations.

15. The method of claim 14, further comprising:

generating an output signal dependent on the value of the dynamic node.

16. The method of claim 15, wherein the first amount of offset current is provided to the dynamic node dependent on the output signal.

17. The method of claim 15, wherein the second amount of offset current is provided to the dynamic node dependent on the output signal.

* * * * *